US011164488B2

(12) United States Patent
Chen et al.

(10) Patent No.: US 11,164,488 B2
(45) Date of Patent: Nov. 2, 2021

(54) INFORMATION DISPLAY BOARD WITH IMPROVED PERFORMANCE BY LIGHT-EXTENDING LIGHT SOURCE HAVING REFLECTIVE PANEL ABOVE LIGHT-EMITTING DIODE

(71) Applicant: NATIONAL CENTRAL UNIVERSITY, Taoyuan (TW)

(72) Inventors: Yi-Chun Chen, Taoyuan (TW); Ted Liang-Tai Lee, Taoyuan (TW); Ching-Cherng Sun, Taoyuan (TW); Tsung-Xian Lee, Taoyuan (TW)

(73) Assignee: NATIONAL CENTRAL UNIVERSITY, Taoyuan (TW)

( * ) Notice: Subject to any disclaimer, the term of this patent is extended or adjusted under 35 U.S.C. 154(b) by 1 day.

(21) Appl. No.: 16/809,037

(22) Filed: Mar. 4, 2020

(65) Prior Publication Data
US 2020/0202754 A1 Jun. 25, 2020

Related U.S. Application Data

(63) Continuation-in-part of application No. 16/193,243, filed on Nov. 16, 2018, now abandoned.

(30) Foreign Application Priority Data

Sep. 26, 2018 (TW) .................. 107133812

(51) Int. Cl.
*G09F 13/22* (2006.01)
*H01L 33/58* (2010.01)
(Continued)

(52) U.S. Cl.
CPC ............... *G09F 13/22* (2013.01); *F21V 3/02* (2013.01); *H01L 33/486* (2013.01); *H01L 33/58* (2013.01);
(Continued)

(58) Field of Classification Search
CPC . G06F 13/22; F21V 3/02; H01L 33/60; H01L 33/486; H01L 33/58
See application file for complete search history.

(56) References Cited

U.S. PATENT DOCUMENTS

2004/0255497 A1* 12/2004 Venkataraman .... G09F 13/0404
40/551
2006/0061487 A1* 3/2006 Heap ....................... G09F 13/22
340/908
(Continued)

*Primary Examiner* — Michael Jung
(74) *Attorney, Agent, or Firm* — Juan Carlos A. Marquez; Marquez IP Law Office, PLLC

(57) ABSTRACT

An information display board with improved display performance by light-extending light sources is revealed. The information display board includes a display board and a plurality of light-extending light sources each of which consists of a light emitting diode (LED) and a reflective panel. The LED has a light emitting side and a backside while the reflective panel is disposed on the light emitting side of the LED for reflecting a part of light emitted from the light emitting side to the display board on the backside to form an expanded area. Thus illuminance and illuminated area of information shown on the display board are increased. By continuous lighting generated, messages/information shown on the information display board such as traffic sign can be read more clearly and comfortably.

13 Claims, 18 Drawing Sheets

(51) Int. Cl.
  *H01L 33/60* (2010.01)
  *H01L 33/48* (2010.01)
  *F21V 3/02* (2006.01)
  *F21Y 115/10* (2016.01)
(52) U.S. Cl.
  CPC ........... *H01L 33/60* (2013.01); *F21Y 2115/10* (2016.08); *G09F 2013/222* (2013.01)

(56) References Cited

U.S. PATENT DOCUMENTS

| | | |
|---|---|---|
| 2008/0086922 A1* | 4/2008 | Chen ................ G09F 13/04 40/550 |
| 2012/0243235 A1 | 9/2012 | Gao |
| 2014/0063779 A1 | 3/2014 | Bradford |
| 2016/0025273 A1 | 1/2016 | van de Ven et al. |

* cited by examiner

INFORMATION DISPLAY BOARD WITH IMPROVED PERFORMANCE BY LIGHT-EXTENDING LIGHT SOURCE HAVING REFLECTIVE PANEL ABOVE LIGHT-EMITTING DIODE

BACKGROUND OF THE INVENTION

1. Technical Field

The present invention relates to an information display board, especially to an information display board with improved display performance by light-extending light sources.

2. Description of Related Art

Light emitting diode (LED) 20 has been widely applied to traffic signs, backlight units for liquid crystal displays (LCD), computers, indicators for home appliances and indicators for vehicles. In the LED available now, a lens is disposed on a light emitting side of the LED. However, the conventional lens has shortcomings of non-uniform lighting distribution and strong glare when light is transmitted from the incident surface to the reflective surface for being reflected totally and side-emitted.

As shown in FIG. 1A, FIG. 1B, and FIG. 1C, a conventional road traffic sign P100 with dot matrix design usually use through-hole light emitting diodes (LED) 20 as light sources. Although this type of LED has the advantages of low price and high availability, the through-hole LED causes infinite contrast and glare while being applied to the traffic sign P100. Moreover, a front illuminated area 511 of illuminated area of the LED 20 is quite small so that a combined message/information formed by point light sources shows a plurality of light spots spaced apart when a plurality of LEDs 20 is arranged on the traffic sign P100.

There is a significant difference between the above multi-spot message/information with spaced light spots and general messages/information formed by continuous lines. In fact, the point light sources spaced apart have the problems of discomfort, poor legibility, etc. Thus there is room for improvement, and there is a need to provide an information display board with improved display performance by light-extending light sources for solving problems of non-uniform light distribution, high glare level, discomfort in use, poor legibility, etc. while the LEDs 20 being applied to information display boards.

SUMMARY OF THE INVENTION

Therefore it is a primary object of the present invention to provide an information display board with improved display performance by light-extending light sources, which improves legibility and visual comfort of information displayed on the information display board while light-extending light sources being applied to display boards.

The present invention provides an information display board with improved display performance by light-extending light sources comprising: a display board provided with at least one piece of information, and a plurality of light-extending light sources disposed correspondingly to the information; each of the light-extending light sources including: a light emitting diode (LED) which is provided with a packaging lens and having a light emitting side facing forward and conforming to the emission direction of the LED, and a backside opposite to the light emitting side; and a reflective panel that is disposed on the light emitting side of the LED and located adjacent to the packaging lens; wherein a part of light emitted from the light emitting side is reflected by the reflective panel toward the display board at the backside of the LED to form a front illuminated area at the light emitting side and a back illuminated area at the backside; the front illuminated area and the back illuminated area are overlapped to form an expanded area; thereby both illuminance and illuminated area of the information are increased due to the expanded area.

Implementation of the present invention at least produces the following advantageous effects:

1. The illumination efficiency of the light-extending light source is improved effectively.
2. A better continuous lighting is provided when a plurality of LEDs is arranged and used.
3. Messages/information shown on display boards such as traffic signs can be perceived and recognized clearly and comfortably.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE INVENTION

Figure 1A:
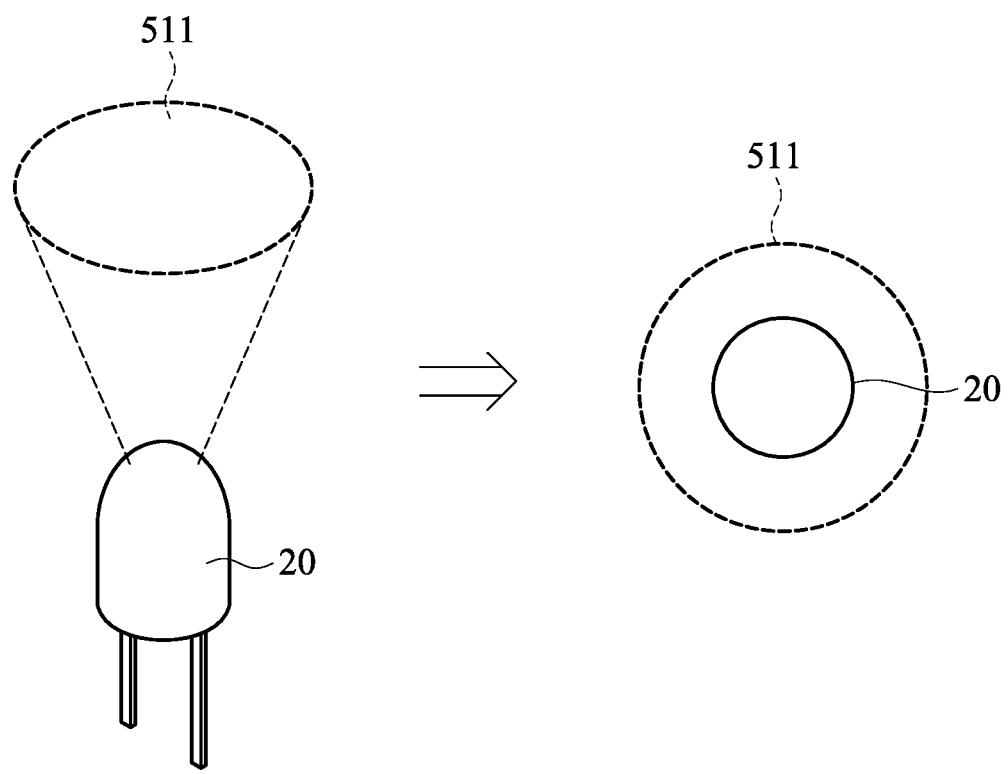
FIG. 1A is a schematic drawing showing a conventional LED and its front illuminated area.
Figure 1B:
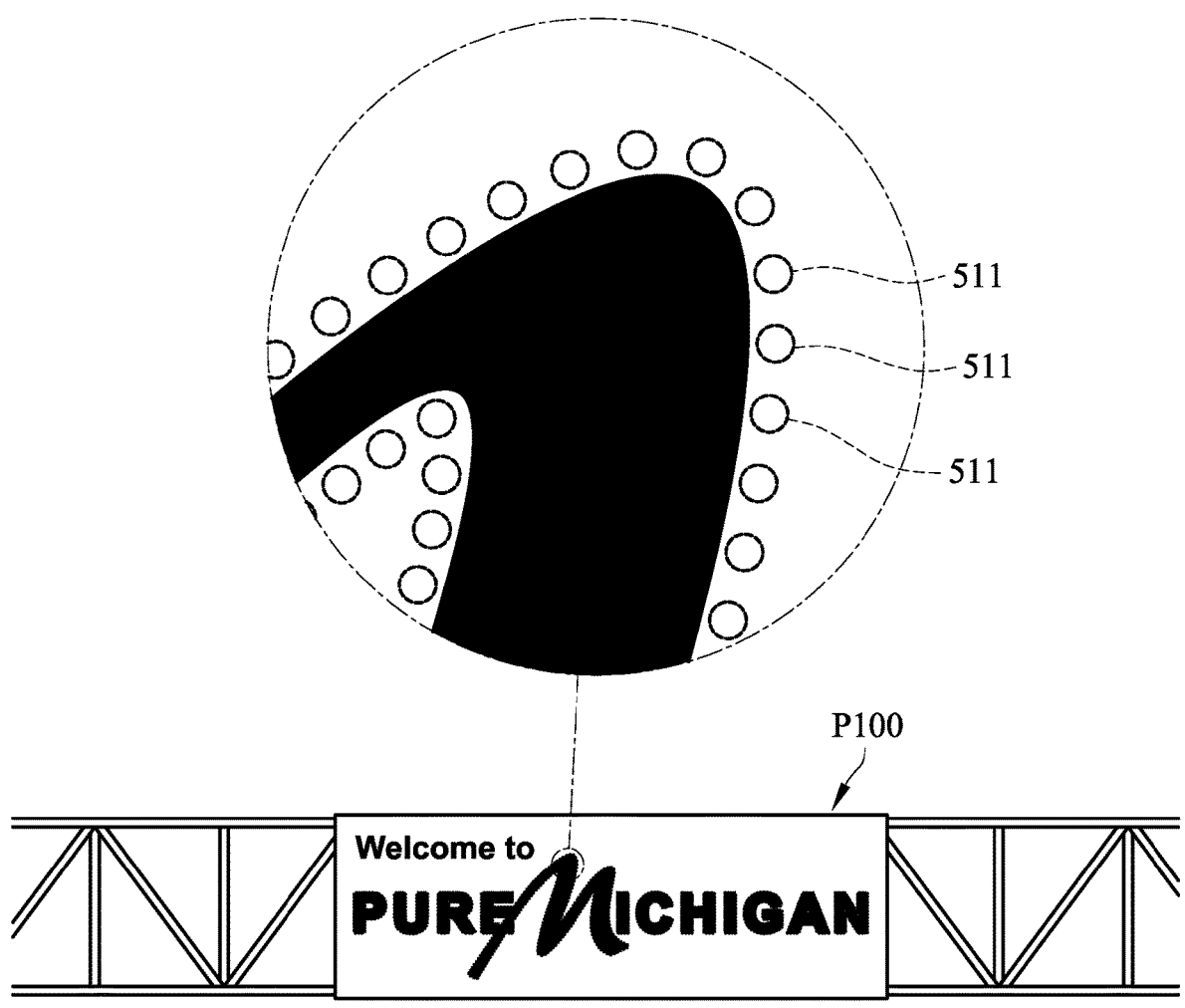
FIG. 1B is a schematic drawing showing a conventional traffic LED display panel.
Figure 1B:
Figure 1C:
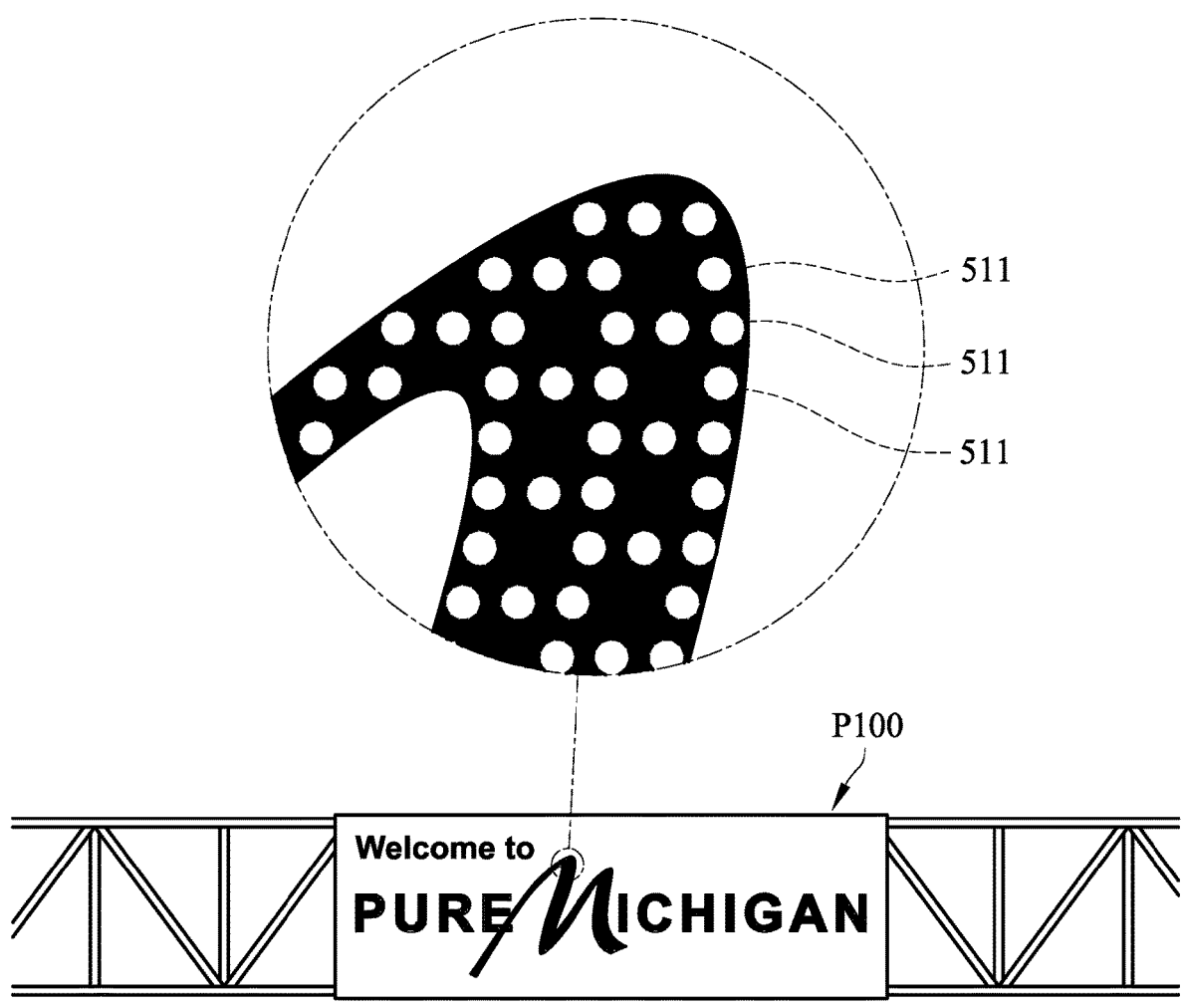
FIG. 1C is a schematic drawing showing another conventional traffic LED display panel.
Figure 1C:
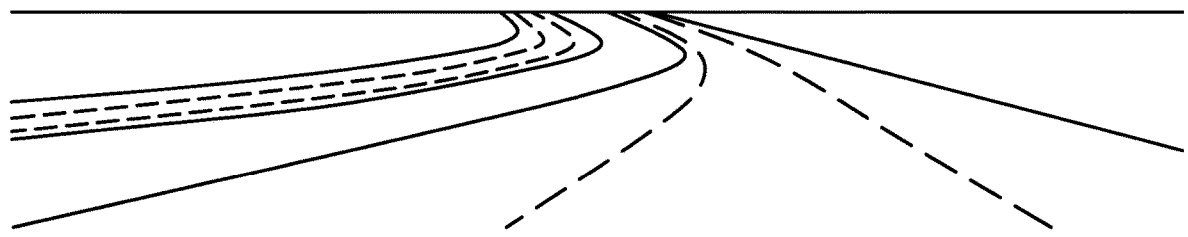
Figure 2A:
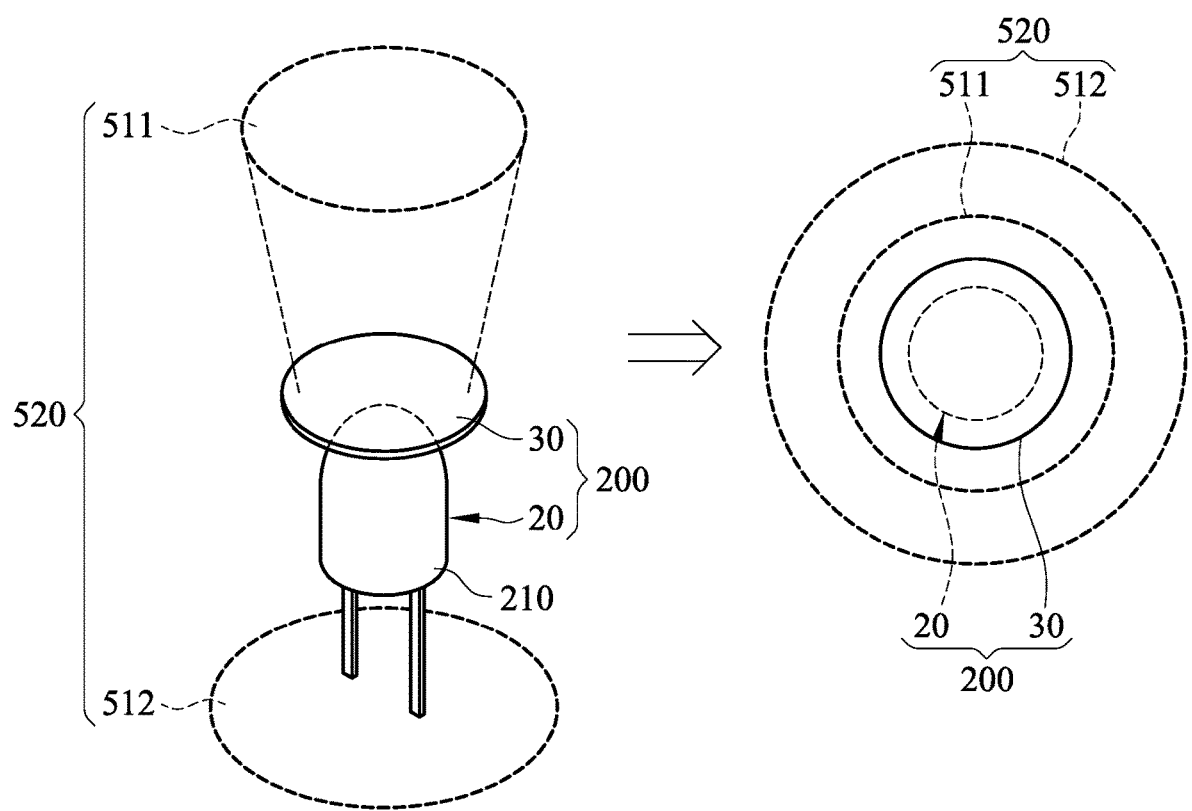
FIG. 2A is a schematic drawing showing a light-extending light source, a front illuminated area, and a back illuminated area according to the present invention.
Figure 2B:
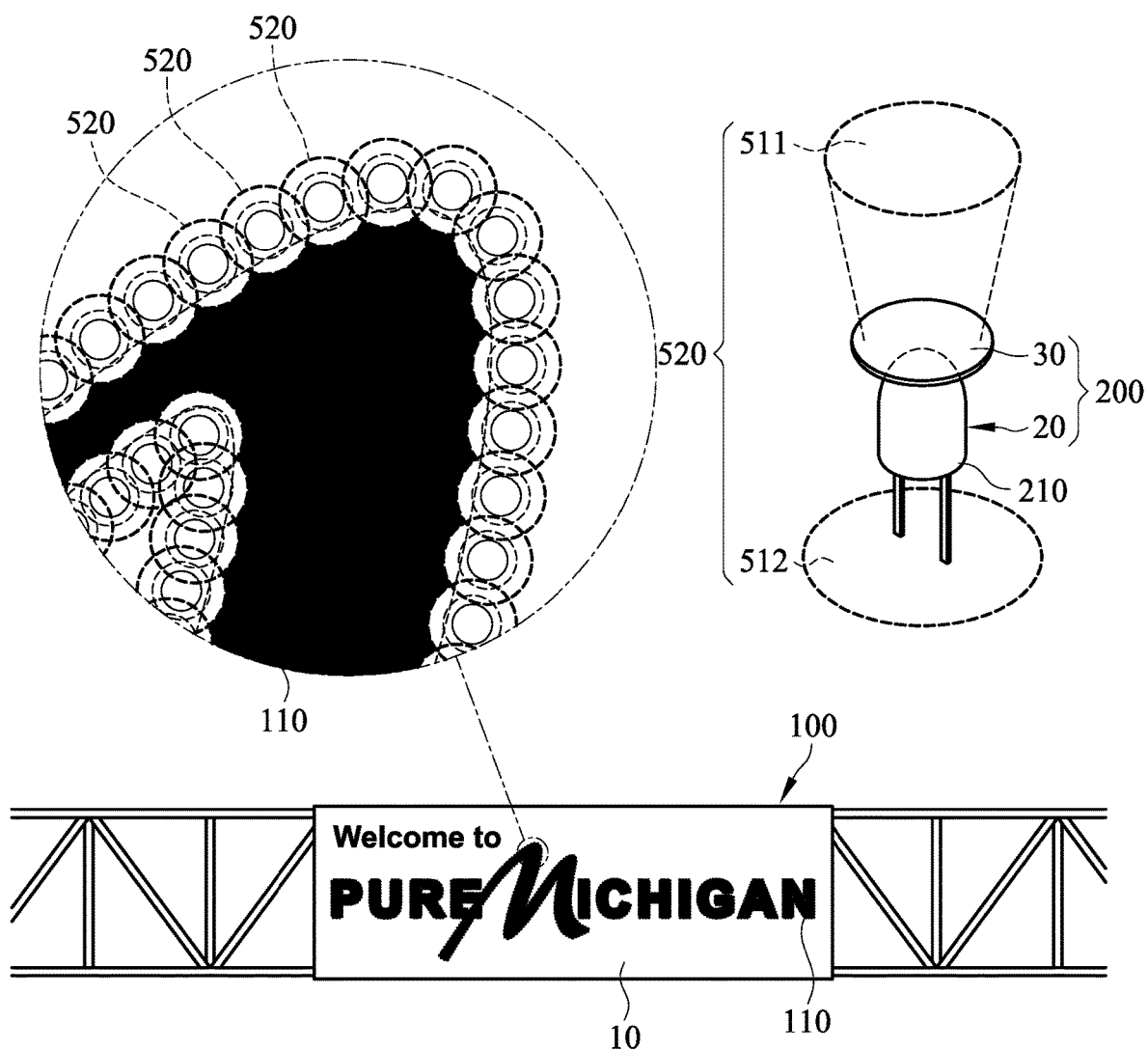
FIG. 2B is a schematic drawing showing an embodiment of a display panel with improved display performance by light-extending light sources according to the present invention.

Refer to FIG. 2A and FIG. 2B, an embodiment of an information display board with improved display performance by light-extending light sources 100 according to the present invention includes a display board 10 and a plurality of light-extending light sources 200 each of which consists of a light emitting diode (LED) 20 and a reflective panel 30.

As shown in FIG. 2A-5C, the display board 10 can be a road traffic sign, a billboard, etc. At least one piece of information 110 such as a word or a figure is displayed on the display board 10. In order to show the information 110 clearly while at night, the light-extending light sources 200 are disposed correspondingly to the information 110. For example, the light-extending light sources 200 are arranged around the periphery of the information 110 or disposed over the information 110 in assistance to the display of the related words or figures.

The LED 20 includes a packaging lens 210. According to the emission direction, a light emitting side facing forward and a backside opposite to the light emitting side are formed on the LED 20. The light emitting side of the LED 20 is the side conforming to the emission direction of the LED 20. The packaging lens 210 used for packaging the LED 20 can be dome lens or in other packaging forms.

The reflective panel 30 which includes a reflective surface is arranged at the light emitting side of the LED 20 and located adjacent to the packaging lens 210. The reflective panel 30 and the packaging lens 210 can be in direct contact with each other, or there is a certain distance (an interval) d between the reflective panel 30 and the packaging lens 210. Thereby a part of light emitted from the light emitting side of the LED 20 is reflected to the display board 10 at the rear of the LED 20 by the reflective panel 30.

Figure 4A:
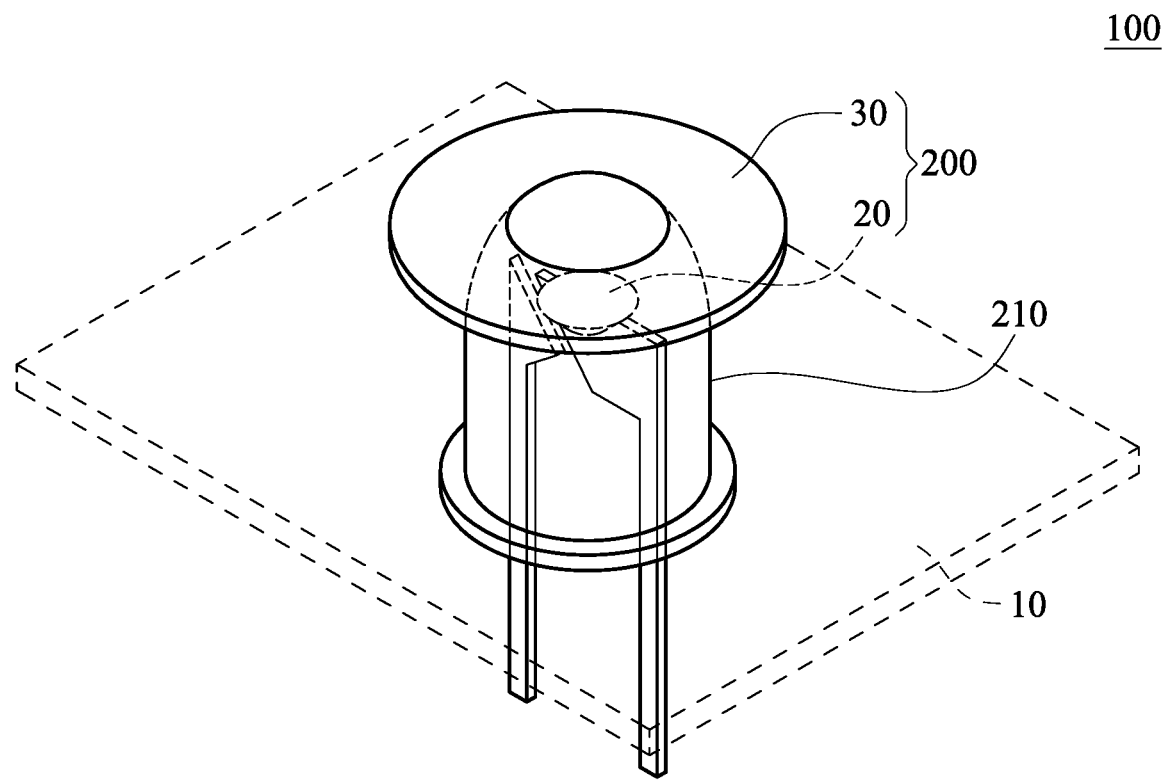
FIG. 4A is the second embodiment of a light-extending light source according to the present invention.
Figure 4B:
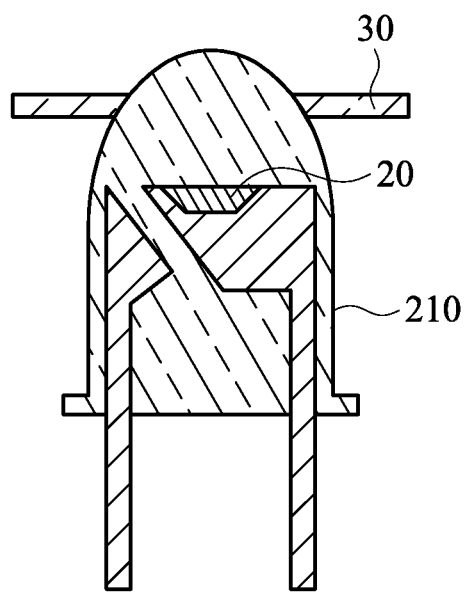
FIG. 4B is a sectional view of the embodiment shown in FIG. 4A.
Figure 4C:
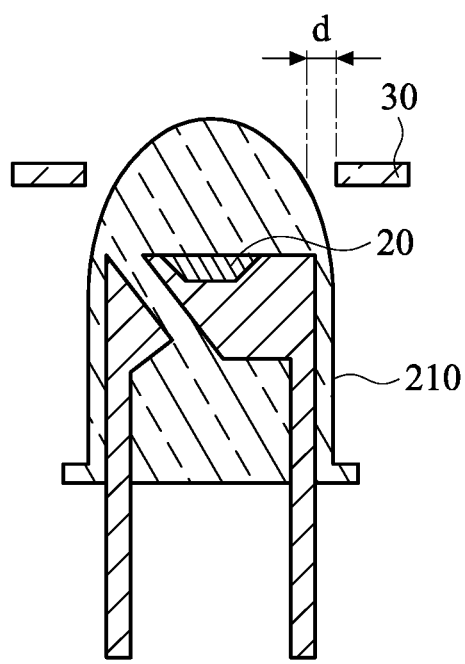
FIG. 4C is a sectional view of the second embodiment shown in FIG. 4A with an interval of d according to the present invention.

As shown in FIG. 4A and FIG. 4C, besides a flat board, the reflective panel 30 can be designed to have an opening which is fitted on the packaging lens 210 at the light emitting side of the LED 20.

Figure 5A:
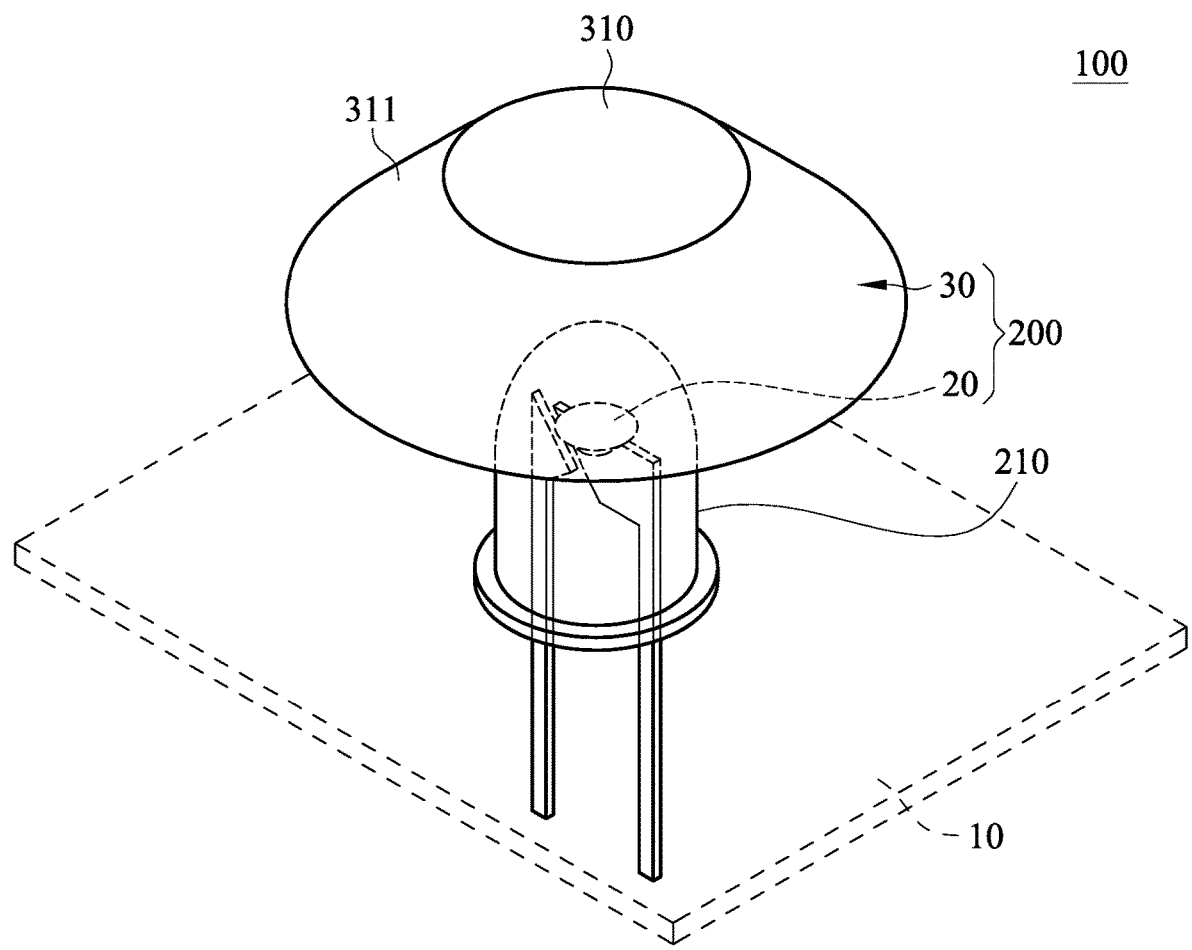
FIG. 5A is the third embodiment of a light-extending light source according to the present invention.
Figure 5B:
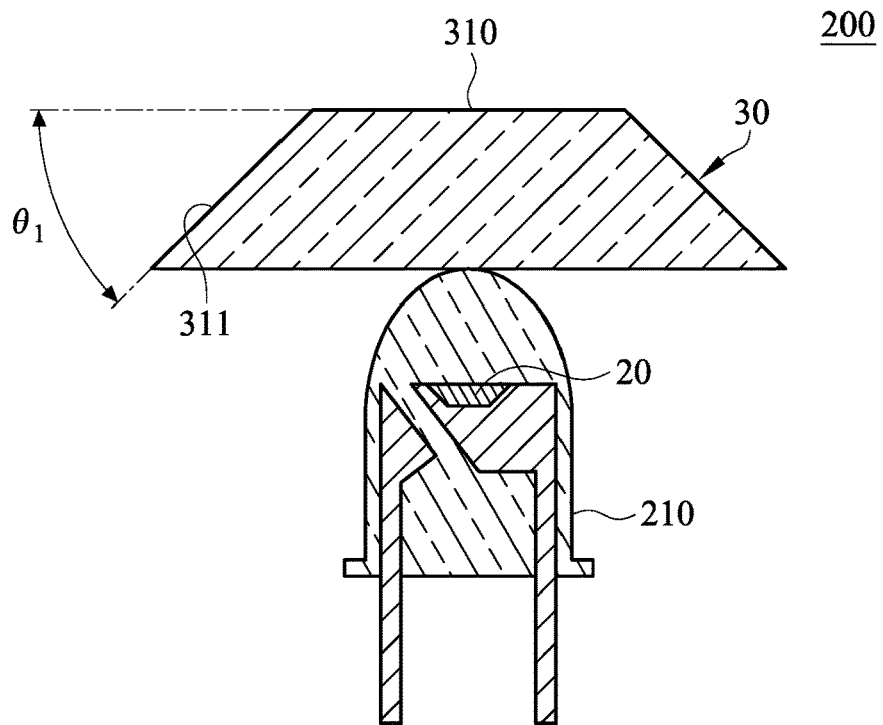
FIG. 5B is a sectional view of the embodiment shown in FIG. 5A.
Figure 5C:
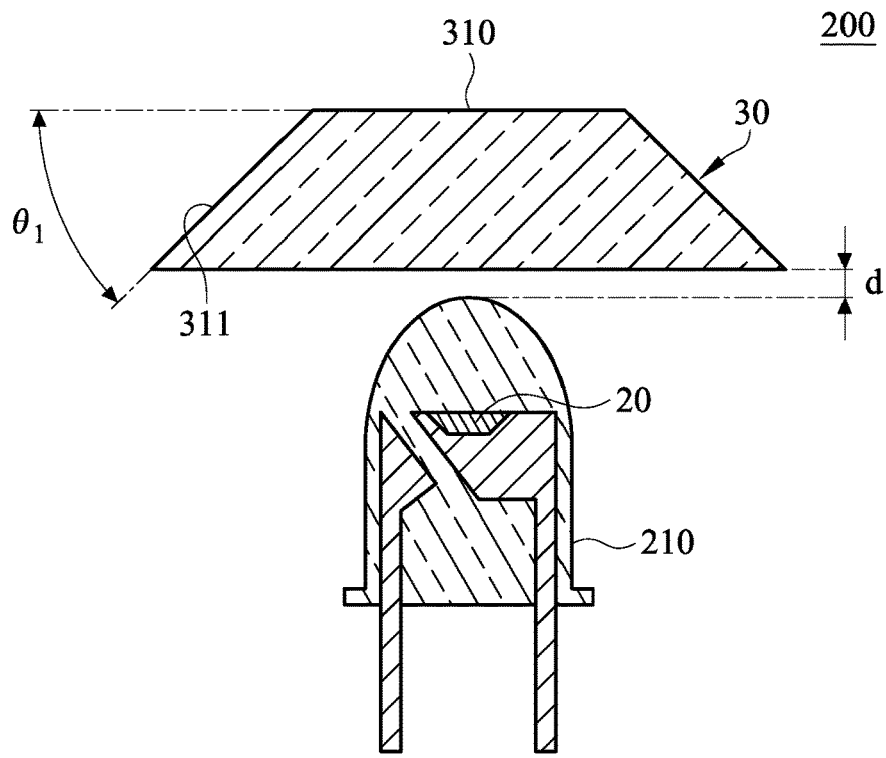
FIG. 5C is a sectional view of the third embodiment shown in FIG. 5A with an interval of d according to the present invention.
Figure 6A:
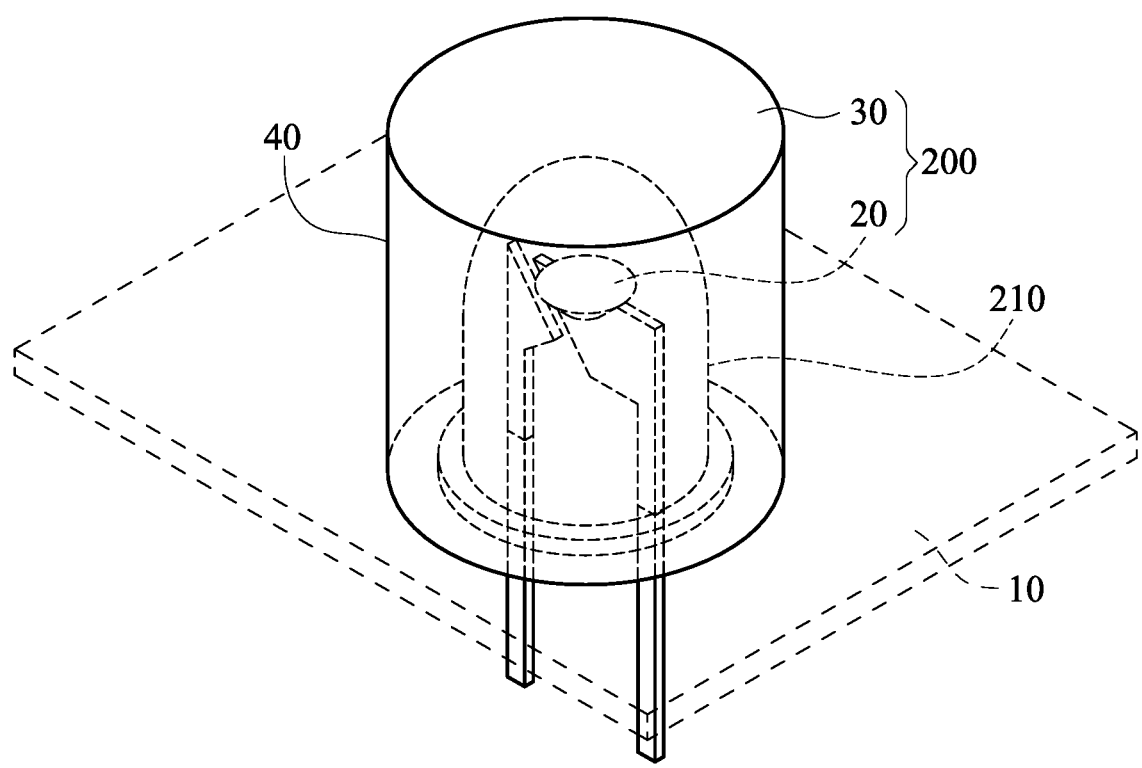
FIG. 6A is the embodiment in FIG. 3B provided with a circular wall according to the present invention.
Figure 6B:
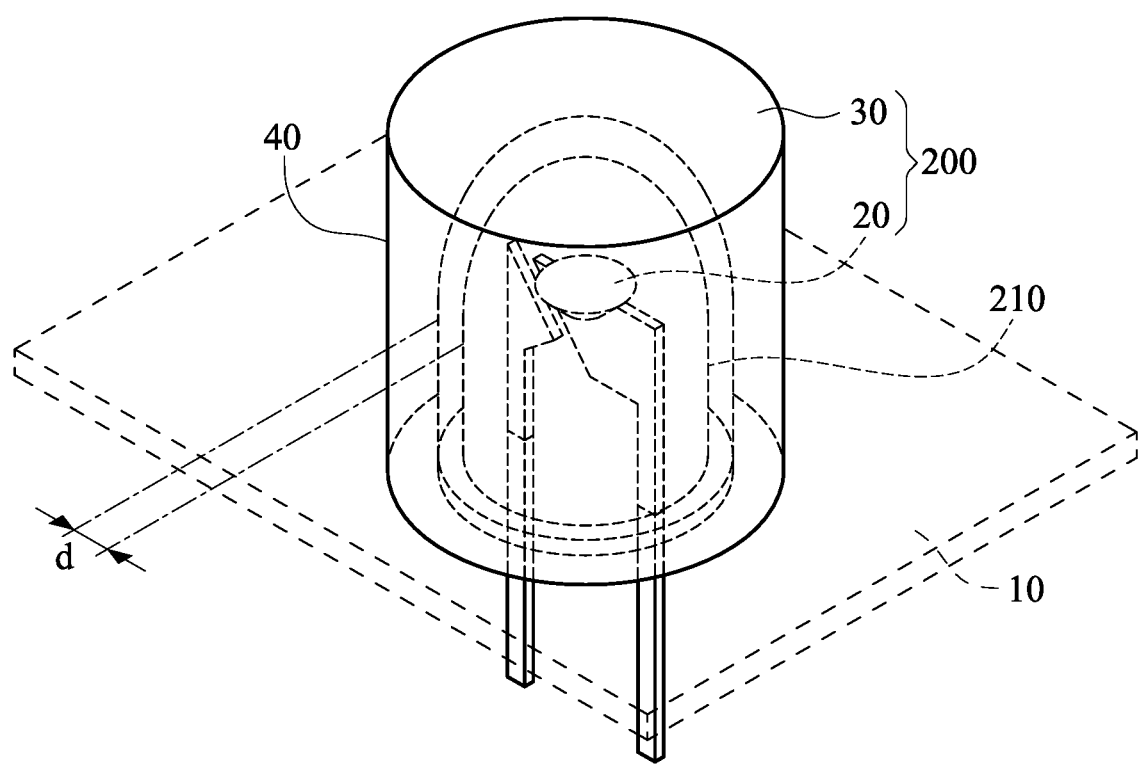
FIG. 6B is the embodiment in FIG. 3C provided with a circular wall according to the present invention.
Figure 6C:
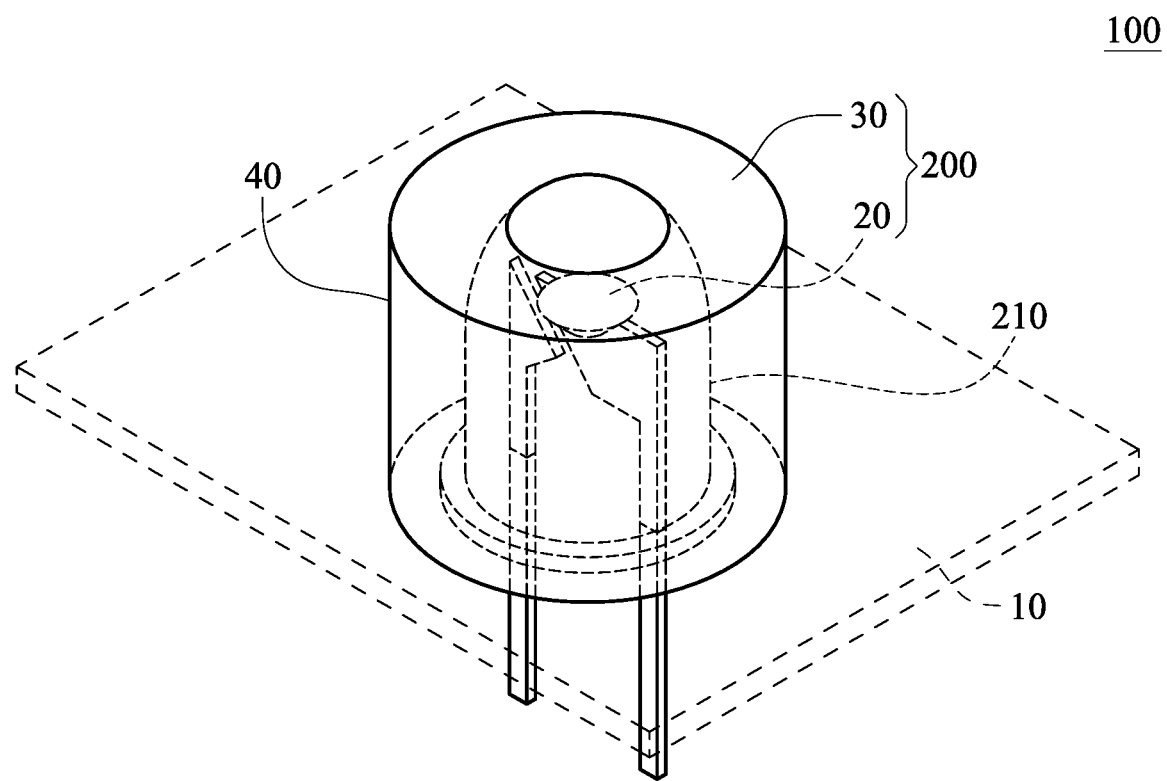
FIG. 6C is the embodiment in FIG. 4B provided with a circular wall according to the present invention.
Figure 6D:
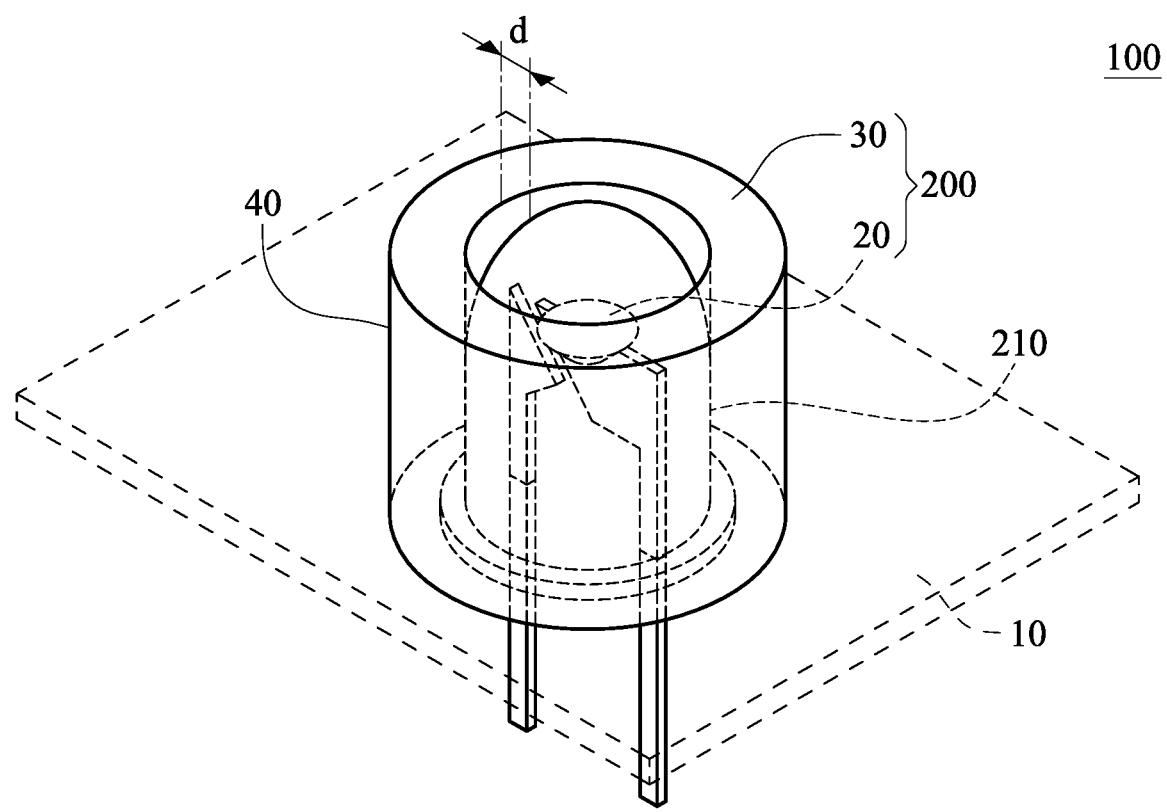
FIG. 6D is the embodiment in FIG. 4C provided with a circular wall according to the present invention.
Figure 6E:
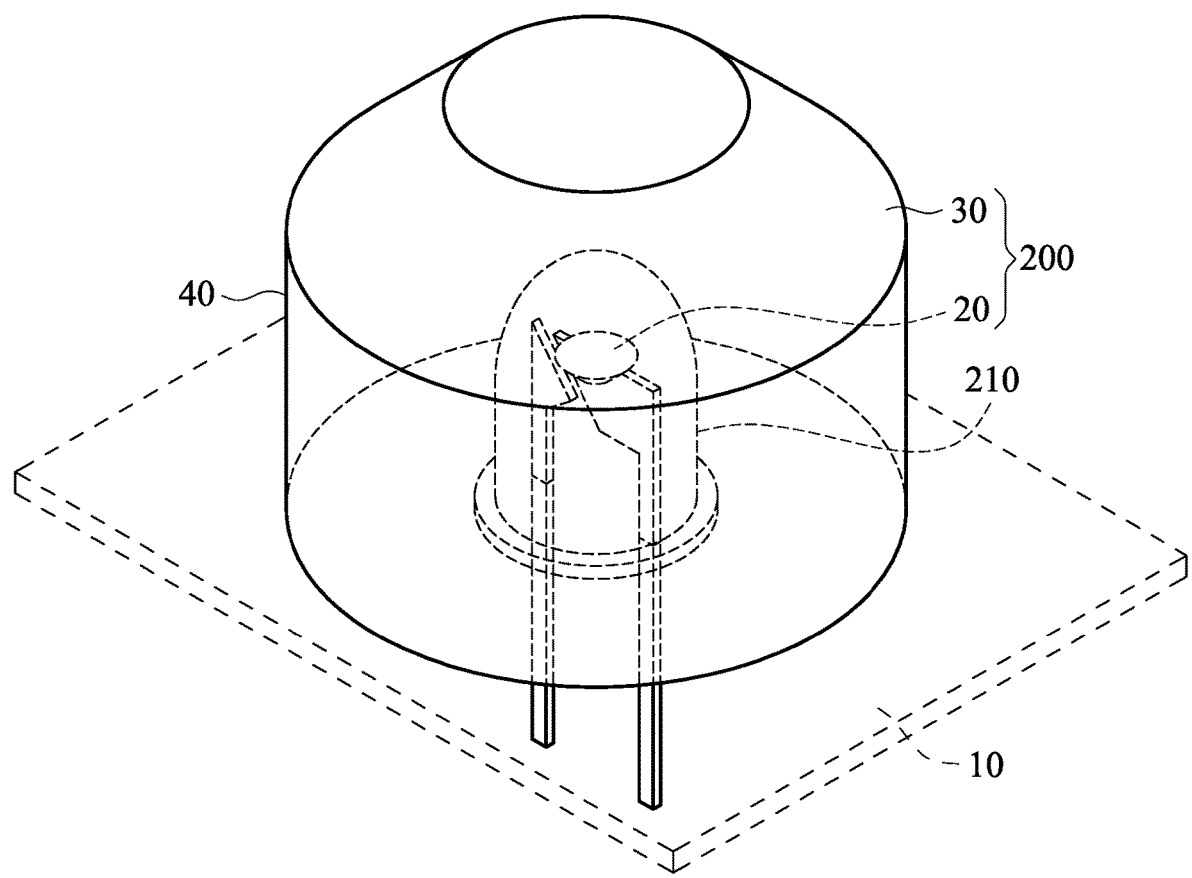
FIG. 6E is the embodiment in FIG. 5B provided with a circular wall according to the present invention.
Figure 6F:
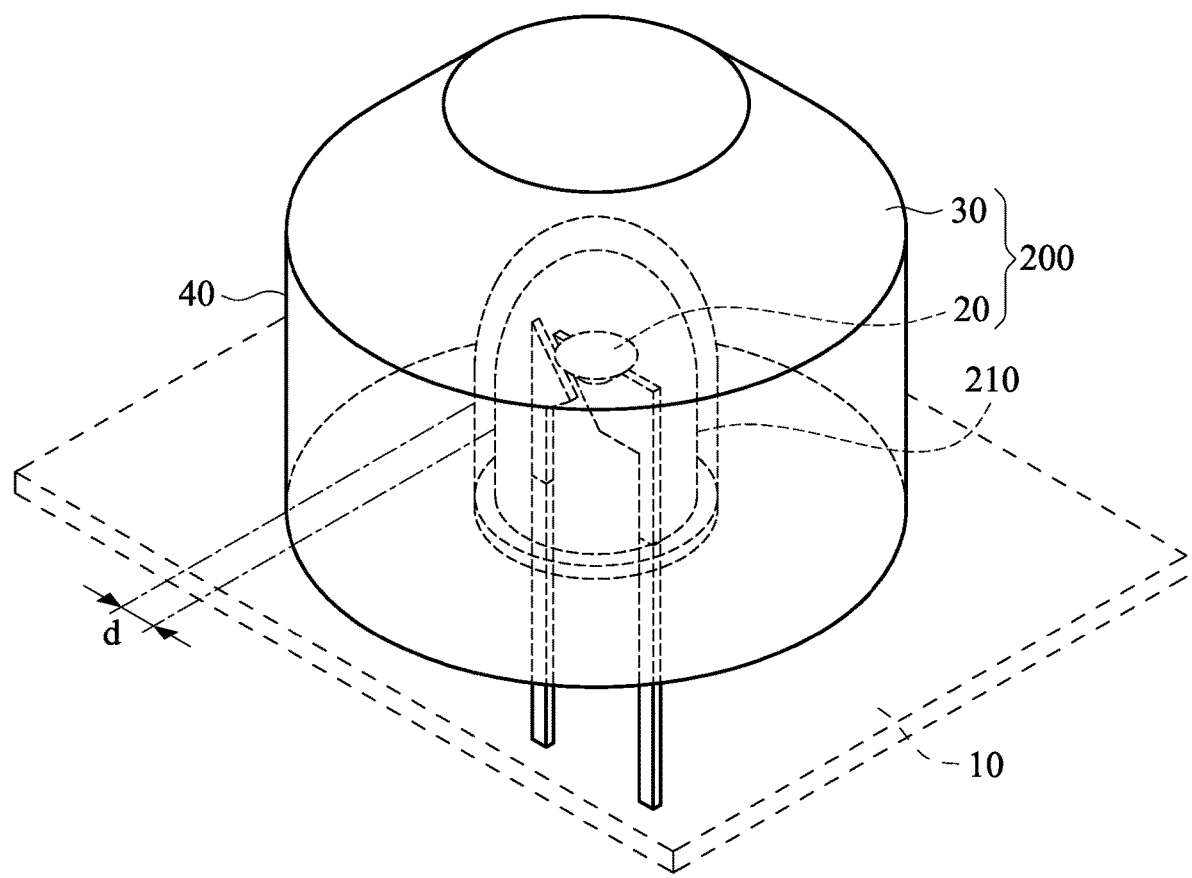
FIG. 6F is the embodiment in FIG. 5C provided with a circular wall according to the present invention.

As shown in FIG. 5A and FIG. 5C, the reflective panel 30 is a flat board 310 provided with an inclined annular surface 311 extending from the periphery of the flat board 310. A first angle $\theta_1$ between the reflective panel 30 and the inclined annular surface 311 can be 45 degrees or others.

In order to balance illumination on the light emitting side and the backside while in use, the design of the reflective panel 30 can be modified for different applications. The reflectivity of the reflective panel 30 is designed to be ranging from 4% to 100% for balancing luminance at the light emitting side and the backside.

Refer to FIG. 6A-FIG. 6F, the light-extending light source 200 further includes a circular wall 40 formed between the reflective panel 30 and the display board 10. Similarly, the reflective panel 30 and the packaging lens 210 can be in direct contact or having a certain distance d therebetween. The circular wall 40 is not only used for supporting the whole reflective panel 30 but also used for mounting and protecting the LED 20. Moreover, the circular wall 40 can also be designed into a light converging element which converges the light reflected by the reflective panel 30.

As shown in FIG. 2A, according to the results of experiments, it is clearly learned that a front illuminated area 511 is formed at the light emitting side of the LED 20 and a back illuminated area 512 is formed at the backside of the LED 20 due to the arrangement of the reflective panel 30. When users are looking at the display board 10 from afar, they can see an expanded area 520 formed by the front illuminated area 511 and the back illuminated area 512 overlapped with each other.

Both the illuminance and the illuminated area of the information 110 are increased due to the expanded area 520. Each expanded area 520 can be partially overlapped with the adjacent expanded area 520 so as to generate more continuous lighting. Thus messages conveyed by the information 110 can be read more clearly and comfortably.

Figure 2C:
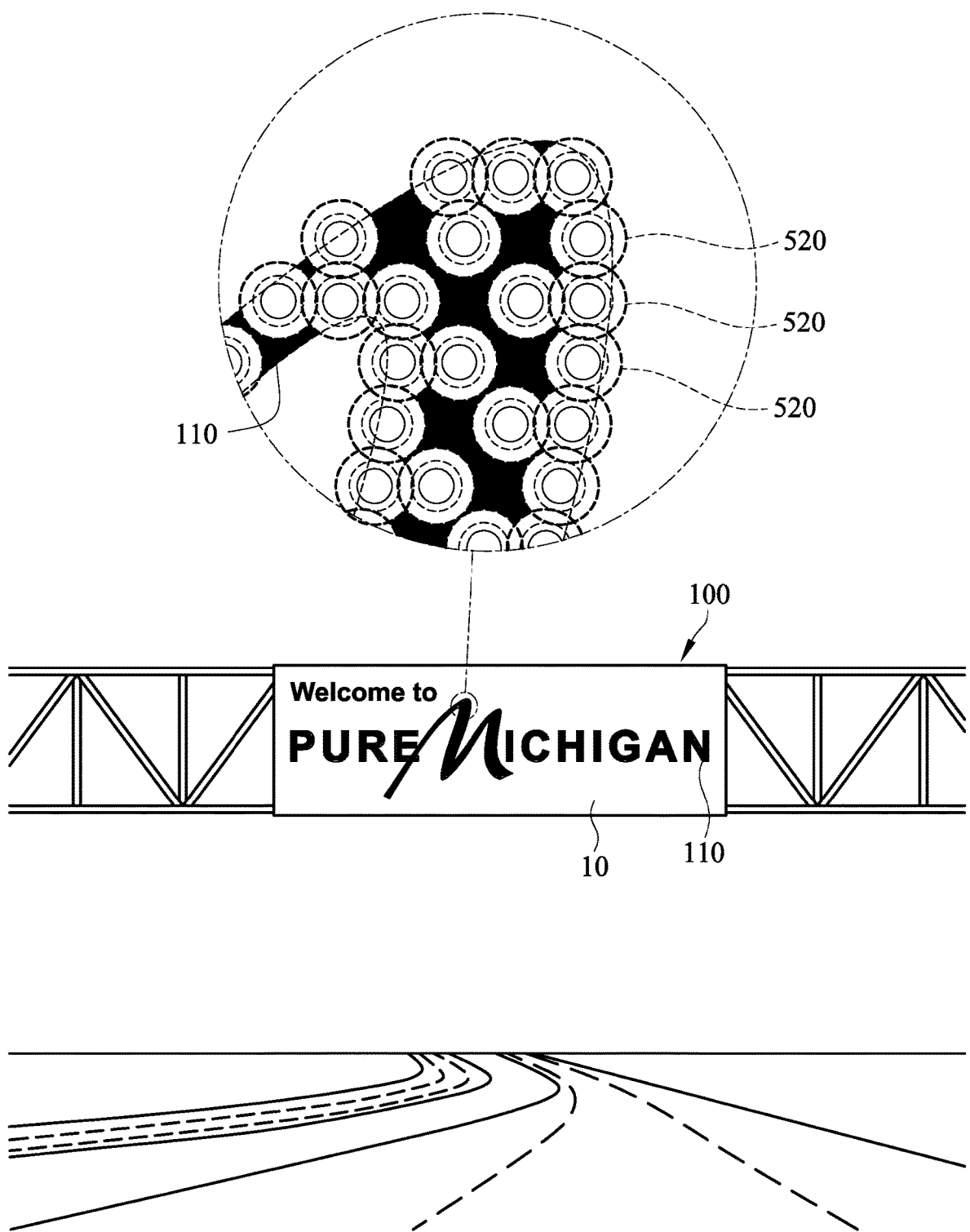
FIG. 2C is a schematic drawing showing another embodiment of a display panel with improved display performance by light-extending light sources according to the present invention.
Figure 3A:
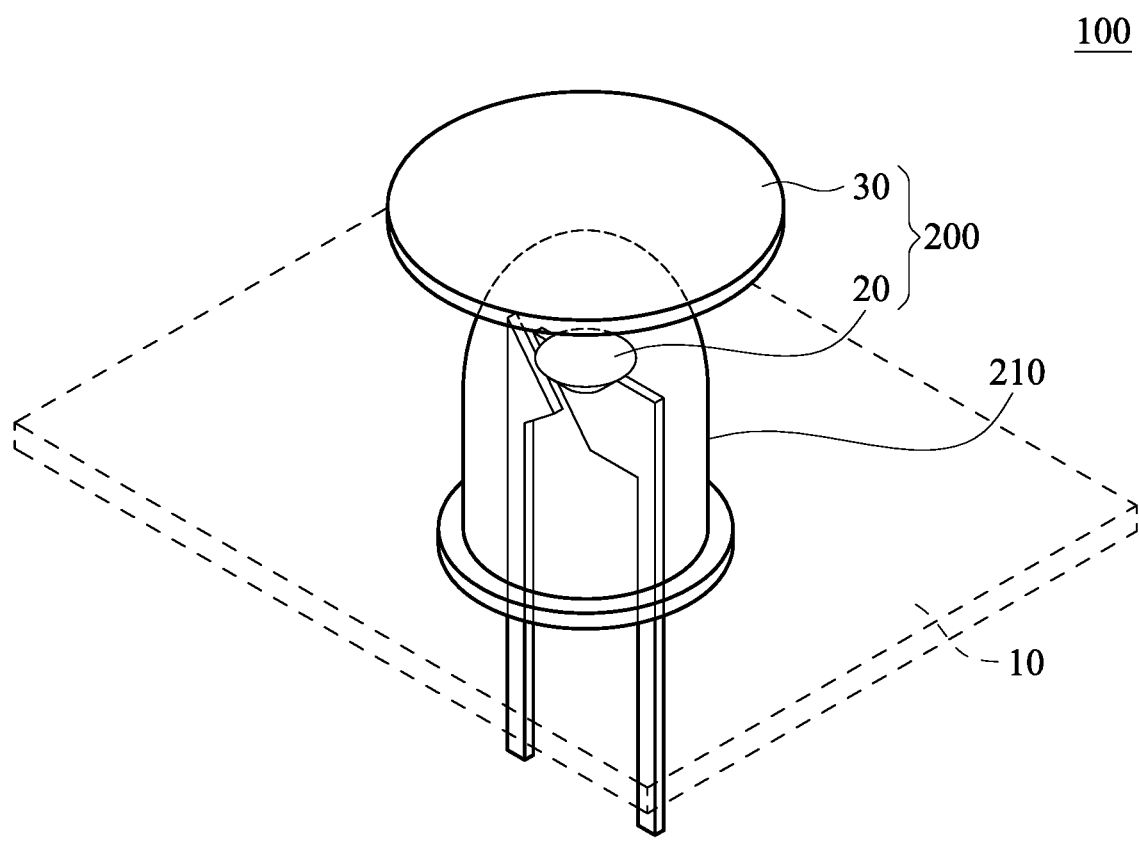
FIG. 3A is the first embodiment of a light-extending light source according to the present invention.
Figure 3B:
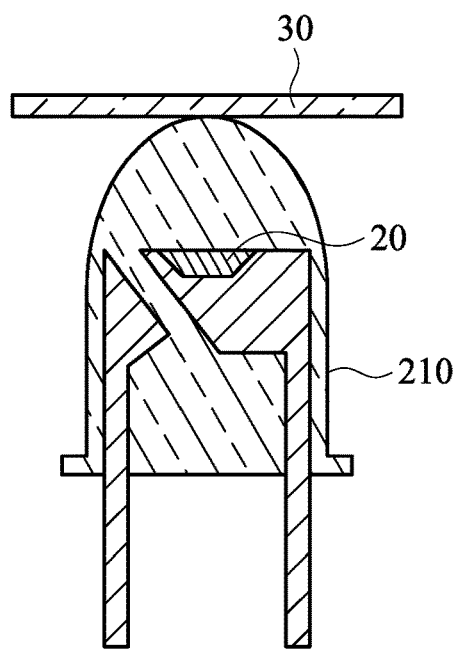
FIG. 3B is a sectional view of the embodiment shown in FIG. 3A.
Figure 3C:
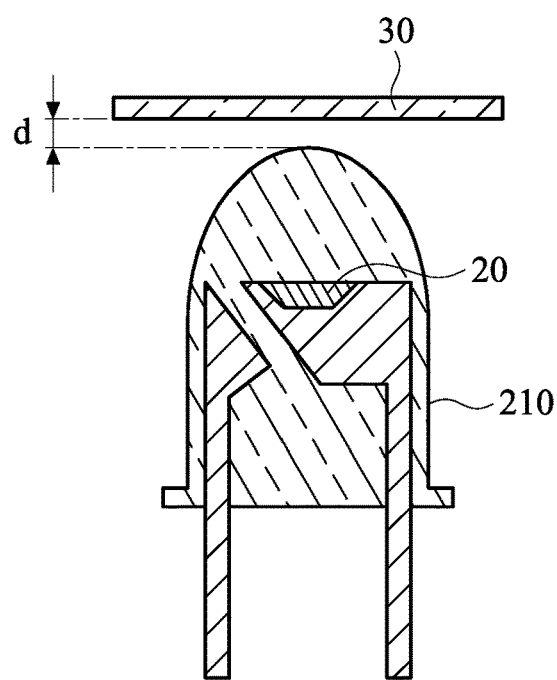
FIG. 3C is a sectional view of the first embodiment shown in FIG. 3A with an interval of d according to the present invention.

As shown in FIG. 2B and FIG. 2C, a dotted combined message presented by a plurality of conventional LEDs 20 on the display board can be improved owing to the illuminated area produced by the LED 20 being enlarged to the expanded area 520 while the light-extending light sources 200 being applied to display boards such as traffic signs. The illuminated area of the adjacent light-extending light sources 200 further intersects to form a linear combined message/information 110. Thereby road users can read and recognize the traffic signs more clearly and comfortably and the legibility is also improved.

The above description is only the preferred embodiments of the present invention and is not intended to limit the present invention in any form. Although the invention has been disclosed as above in the preferred embodiments, they are not intended to limit the invention. A person skilled in the relevant art will recognize that equivalent embodiment modified and varied as equivalent changes disclosed above can be used without parting from the scope of the technical solution of the present invention. All the simple modification, equivalent changes and modifications of the above embodiments according to the material contents of the invention shall be within the scope of the technical solution of the present invention.

What is claimed is:

1. An information display board with improved performance by light-extending light sources having a reflective panel above a light-emitting diode comprising:

a display board provided with at least one piece of information; and a plurality of light-extending light sources disposed correspondingly to the information and each of the light-extending light sources includes:

a light emitting diode (LED) which is provided with a packaging lens and having a light emitting side facing forward and conforming to emission direction of the LED, and a backside opposite to the light emitting side; and a reflective panel that is disposed on the light emitting side of the LED and located adjacent to the packaging lens;

wherein the reflective panel is configured to reflect a part of light emitted from the light emitting side toward the display board facing the backside of the LED, forming an expanded area including a front illuminated area above the reflective panel and a back illuminated area on the display board to form an expanded area, wherein the back illuminated area is configured to surround an outer periphery of the front illuminated area thereby forming the expanded area.

2. The device as claimed in claim 1, wherein a reflectivity of the reflective panel is ranging from 4% to 100%.

3. The device as claimed in claim 1, wherein each of the light-extending light sources further includes a circular wall formed between the reflective panel and the display board.

4. The device as claimed in claim 1, wherein the reflective panel has an opening and the opening is mounted on the packaging lens at the light emitting side.

5. The device as claimed in claim 4, wherein each of the light-extending light sources further includes a circular wall disposed between the reflective panel and the display board.

6. The device as claimed in claim 1, wherein the reflective panel is a flat board provided with an inclined annular surface extending from the periphery of the flat board.

7. The device as claimed in claim 6, wherein an angle between the reflective panel and the inclined annular surface is 45 degrees or others.

8. The device as claimed in claim 6, wherein the light-extending light source further includes a circular wall which is disposed between the reflective panel and the display board.

9. The device as claimed in claim 1, wherein the packaging lens is a dome lens.

10. The device as claimed in claim 1, wherein the display board is a traffic sign or a billboard.

11. The device as claimed in claim 1, wherein the light-extending light sources are arranged around the periphery of the information or disposed over the information.

12. The device as claimed in claim 1, wherein the expanded area is partially overlapped with the adjacent expanded area.

13. A method for operating an information display board with improved display performance by light-extending light sources comprising the steps of:
   providing a display board provided with at least one piece of information; and
   disposing a plurality of light-extending light sources correspondingly to the information, wherein each of the plurality of light-extending light sources includes:
      a light emitting diode (LED) having a packaging lens and having a light emitting side facing forward and conforming to emission direction of the LED, and a backside opposite to the light emitting side, and
      a reflective panel disposed on the light emitting side of the LED and located adjacent to the packaging lens;
   reflecting a part of light emitted from the light emitting side via the reflective panel toward the display board facing backside of the LED to form an expanded area; and
   forming a front illuminated area above the reflective panel and a back illuminated area on the display board to form an expanded area, wherein the back illuminated area is configured to surround an outer periphery of the front illuminated area thereby forming the expanded area.

* * * * *